United States Patent
Chen et al.

(10) Patent No.: US 6,242,352 B1
(45) Date of Patent: *Jun. 5, 2001

(54) METHOD OF PREVENTING MICRO-SCRATCHES ON THE SURFACE OF A SEMICONDUCTOR WAFER WHEN PERFORMING A CMP PROCESS

(75) Inventors: Chien-Hung Chen; Juan-Yuan Wu, both of Hsin-Chu; Water Lu, Taipei, all of (TW)

(73) Assignee: United Microelectronics Corp., Hsin-Chu (TW)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/264,013

(22) Filed: Feb. 8, 1999

(51) Int. Cl.[7] .................................................. H01L 21/302
(52) U.S. Cl. .......................... 438/691; 438/692; 438/697; 438/700; 438/704; 438/706; 438/723
(58) Field of Search ..................................... 438/692, 697, 438/704, 691, 706, 723, 724, 756, 700, 757

(56) References Cited

U.S. PATENT DOCUMENTS

| | | | |
|---|---|---|---|
| 5,196,353 | * 3/1993 | Sandhu et al. | 438/5 |
| 5,298,110 | * 3/1994 | Schoenborn et al. | 438/5 |
| 5,429,711 | * 7/1995 | Watanabe et al. | 438/464 |
| 5,492,858 | * 2/1996 | Bose et al. | 438/437 |
| 5,494,857 | * 2/1996 | Cooperman et al. | 438/437 |
| 5,663,107 | * 9/1997 | Peschke et al. | 438/692 |
| 5,668,063 | * 9/1997 | Fry et al. | 438/692 |
| 5,702,977 | * 12/1997 | Jang et al. | 216/38 |

\* cited by examiner

*Primary Examiner*—Benjamin L. Utech
*Assistant Examiner*—Binh X. Tran
(74) *Attorney, Agent, or Firm*—Winston Hsu

(57) ABSTRACT

The present invention relates to a method for removing a first dielectric layer of a semiconductor wafer. The first dielectric layer is formed on the surface of a second dielectric layer of the semiconductor wafer. The method comprises performing a chemical mechanical polishing (CMP) process on the first dielectric layer to remove a predetermined thickness of the first dielectric layer, measuring the remaining thickness of the first dielectric layer, providing an etching table having a plurality of thickness ranges of the remaining first dielectric layer and corresponding etching back procedure or parameters of each of the thickness ranges, and performing an etching back process to horizontally remove the remaining first dielectric layer according to the etching back procedure or parameters of the thickness range corresponding to the measured thickness of the remaining first dielectric layer.

9 Claims, 6 Drawing Sheets

METHOD OF PREVENTING MICRO-SCRATCHES ON THE SURFACE OF A SEMICONDUCTOR WAFER WHEN PERFORMING A CMP PROCESS

BACKGROUND OF THE INVENTION

1. Field of the Invention

The present invention relates to a semiconductor wafer, and more particularly, to a method of preventing micro-scratches on the surface of a semiconductor wafer during chemical mechanical polishing.

2. Description of the Prior Art

The CMP (chemical-mechanical polishing) process is a very commonly used semiconductor process. It is performed to planarize the surface of the semiconductor wafer by removing unwanted substance from it. The polish rate of the CMP process varies with the use of different polishing media and is therefore very difficult to control. This often leads to over-etching or under-etching. In a semiconductor wafer that has shallow trenchs, the CMP process is performed to remove only a portion of unwanted substance, and the remaining unwanted substance is removed by using a method with a more stable polish rate to prevent micro-scratches caused by over-etching.

Please refer to FIG. 1. FIG. 1 is a cross-sectional view of a prior art semiconductor wafer 10 before performing a CMP process. The semiconductor wafer 10 comprises a silicon substrate 12, a pad oxide layer 14 composed of silicon oxide ($SiO_x$) formed on the silicon substrate 12, a second dielectric layer 16 composed of silicon nitride ($Si_3N_x$) deposited on the pad oxide layer 14, a plurality of shallow trenches 18 positioned on the silicon substrate 12 for isolating components on the semiconductor wafer 10, and a first dielectric layer 20 composed of silicon oxide ($SiO_x$) positioned on the second dielectric layer 16 for filling the shallow trenches 18.

Please refer to FIG. 2. FIG. 2 is a cross-sectional view of the semiconductor wafer 10 after performing the CMP process. When the CMP process is performed on the first dielectric layer 20 of the semiconductor wafer 10, a predetermined thickness of the first dielectric layer 20 is removed to make the surface of the semiconductor wafer 10 approximately even. Then the remaining height of the first dielectric layer 20 is measured. If the remaining thickness is within a predetermined range, the remaining first dielectric layer 20 is removed horizontally by performing an etching back process. Please refer to FIG. 3. FIG. 3 is a cross-sectional view of the semiconductor wafer 10 after performing the etching back process. After performing the etching back process, a flat surface is formed by the second dielectric layer 16 and several shallow trenches 18 on the semiconductor wafer 10.

Please refer to FIG. 4. FIG. 4 is a flowchart of a prior art etching method 22. To accurately perform the etching back process, the predetermined range of remaining thickness of the first dielectric layer 20 is defined very small. Because the polishing rate of the CMP process is unstable, the remaining thickness of the first dielectric layer 20 frequently exceeds the predetermined range. If the remaining thickness of the first dielectric layer 20 exceeds the predetermined range, the etching back process cannot be performed, and the operators have to stop the process and perform special, time-consuming manipulations. The etching method 22 is very rigid and often interrupts the process thus increasing the workload of process engineers.

SUMMARY OF THE INVENTION

It is therefore a primary objective of the present invention to provide a method to solve the above mentioned problem.

In a preferred embodiment, the present invention relates to a method for removing a first dielectric layer of a semiconductor wafer, the first dielectric layer being formed on the surface of a second dielectric layer of the semiconductor wafer, the method comprising:

performing a chemical mechanical polishing (CMP) process on the first dielectric layer to remove a predetermined thickness of the first dielectric layer;

measuring the remaining thickness of the first dielectric layer;

providing an etching table having a plurality of thickness ranges of the remaining first dielectric layer and corresponding etching back procedure or parameters of each of the thickness ranges; and performing an etching back process to horizontally remove the remaining first dielectric layer according to the etching back procedure or parameters of the thickness range corresponding to the measured thickness of the remaining first dielectric layer.

It is an advantage of the present invention that the etching back process is performed according to the thickness of the remaining first dielectric layer. This means the thickness of the remaining first dielectric layer can have a more flexible range, and thus micro-scratches caused by over-etching can be avoided.

These and other objectives of the present invention will no doubt become obvious to those of ordinary skill in the art after reading the following detailed description of the preferred embodiment which is illustrated in the various figures and drawings.

DETAILED DESCRIPTION OF THE PREFERRED EMBODIMENT

Figure 1:
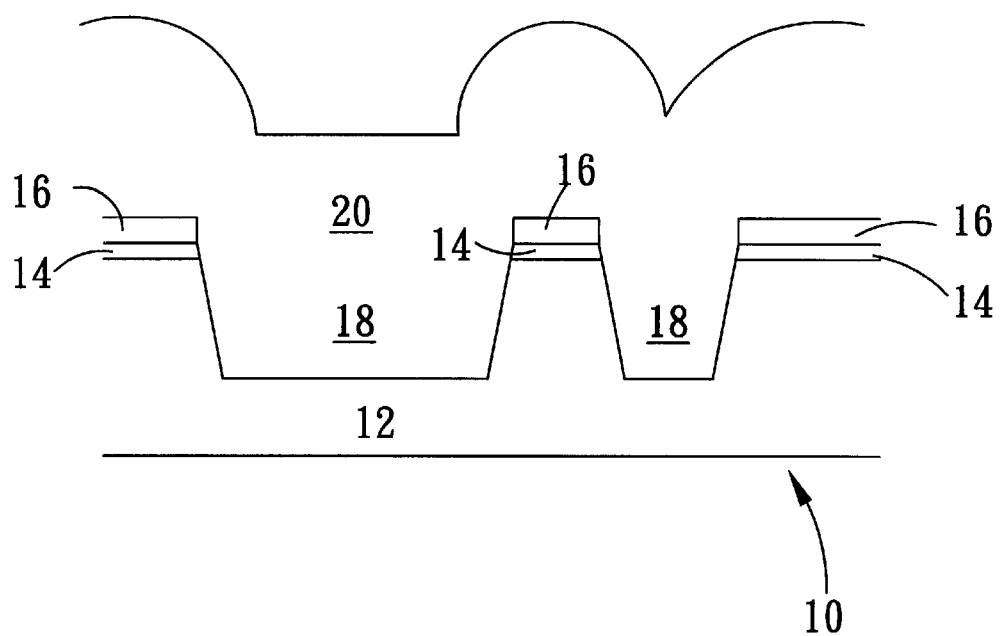
FIG. 1 is a cross-sectional view of a prior art semiconductor wafer before performing a CMP process.
Figure 2:
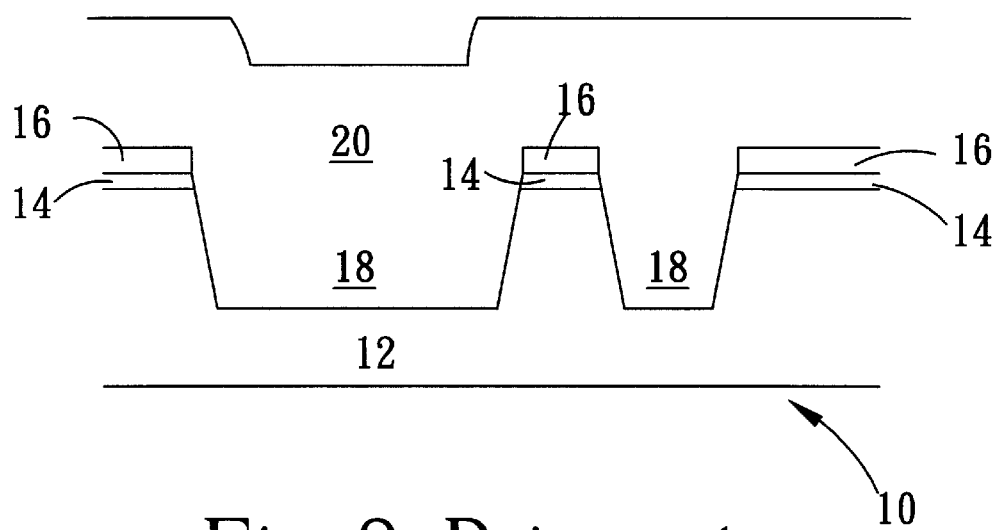
FIG. 2 is a cross-sectional view of the semiconductor wafer in FIG. 1 after performing the CMP process.
Figure 3:
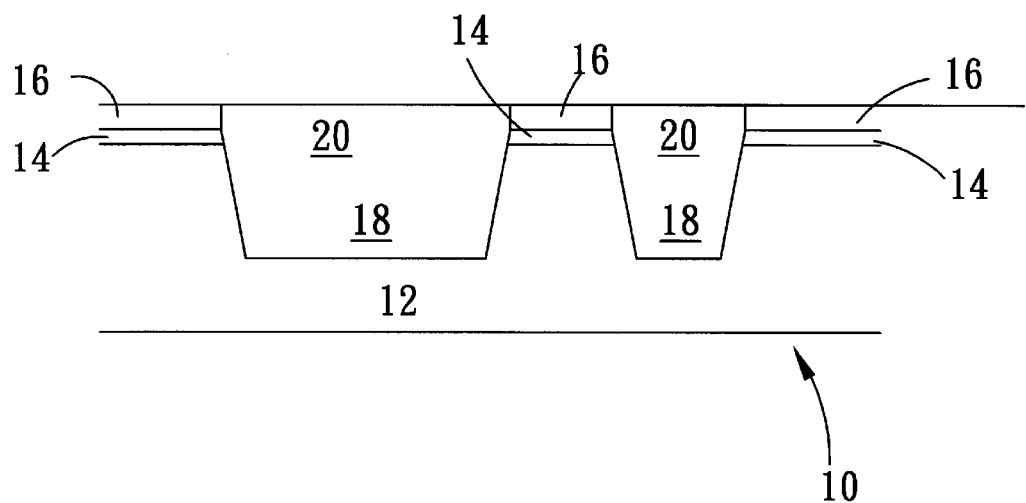
FIG. 3 is a cross-sectional view of the semiconductor wafer in FIG. 1 after performing an etching back process.
Figure 5:
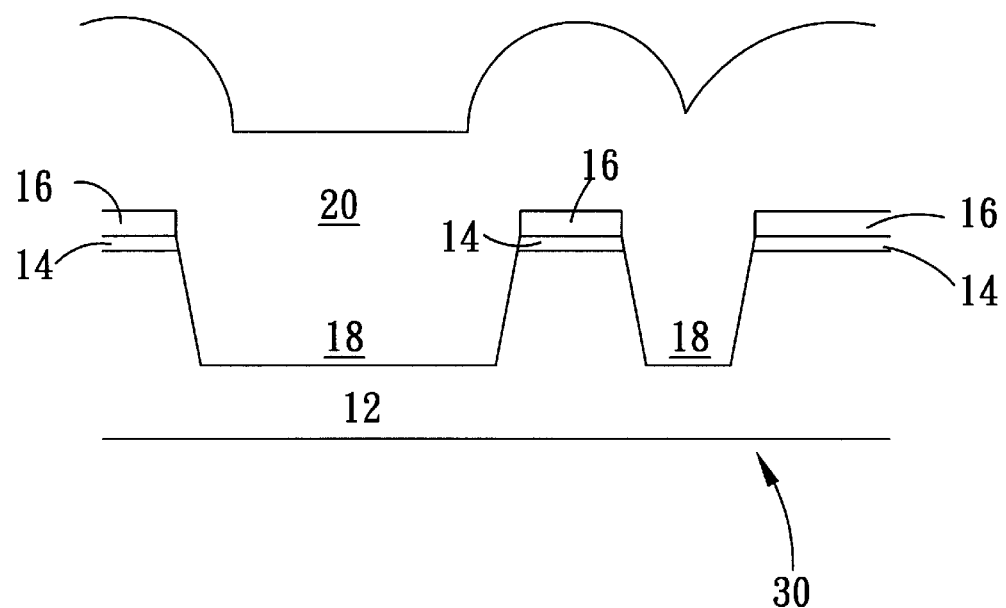
FIG. 5 is a cross-sectional view of a semiconductor wafer before performing a CMP process according to the present invention.
Figure 4:
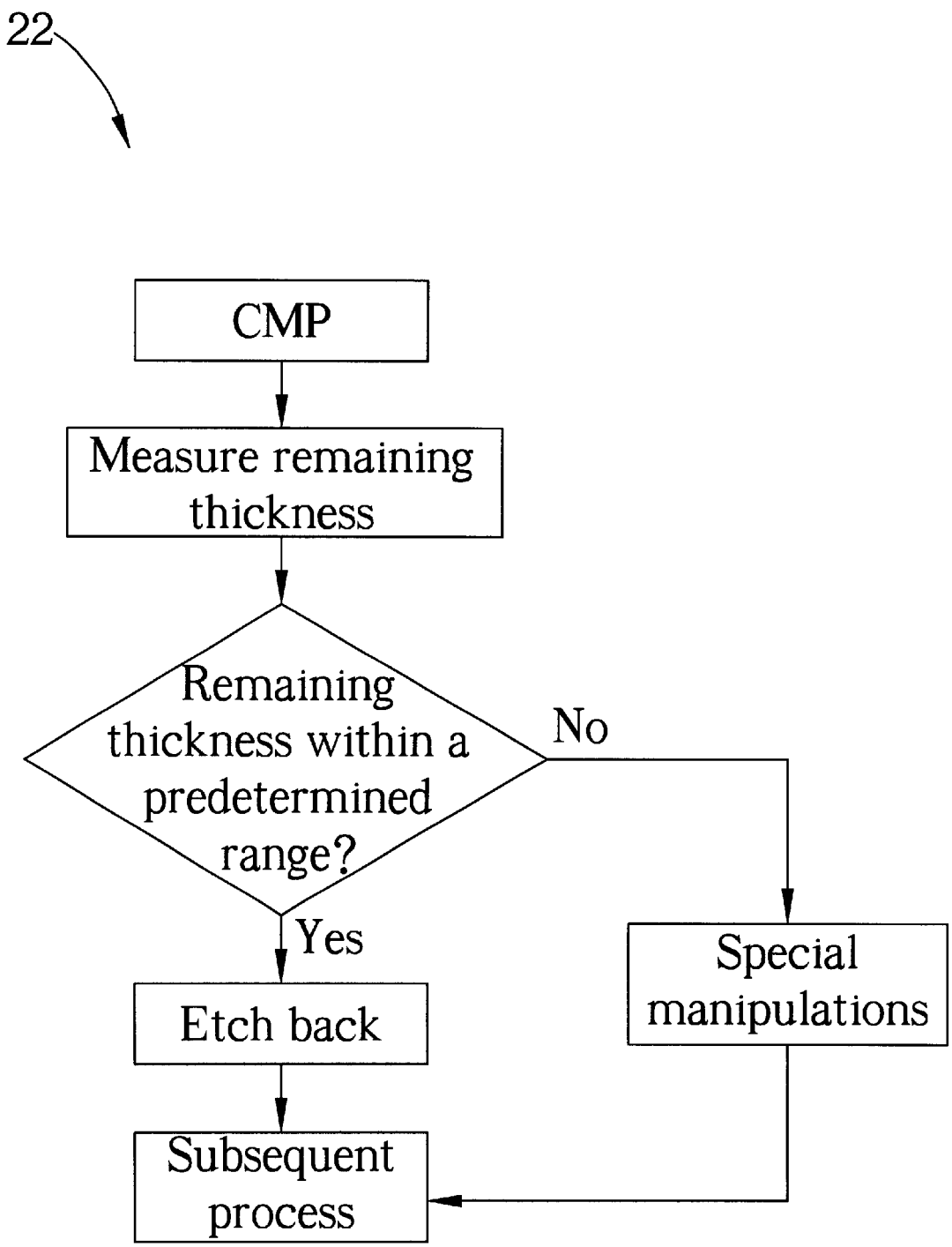
FIG. 4 is a flowchart of a prior art etching method.

Please refer to FIG. 5. FIG. 5 is a cross-sectional view of a semiconductor wafer 30 before performing a CMP process according to the present invention. The semiconductor wafer 30 comprises a silicon substrate 12, a pad oxide layer 14 composed of silicon oxide ($SiO_x$) formed on the silicon substrate 12, a second dielectric layer 16 composed of silicon nitride ($SiN_x$) deposited on the pad oxide layer 14, a plurality of shallow trenches 18 positioned on the silicon substrate 12 for isolating components on the semiconductor wafer 30, and a first dielectric layer 20 composed of silicon oxide ($SiO_x$) positioned on the second dielectric layer 16 for filling the shallow trenches 18. The pad oxide layer 14 is positioned to prevent damages to the semiconductor wafer 30 from surface stress caused by heating the second dielectric layer 16.

Figure 6:
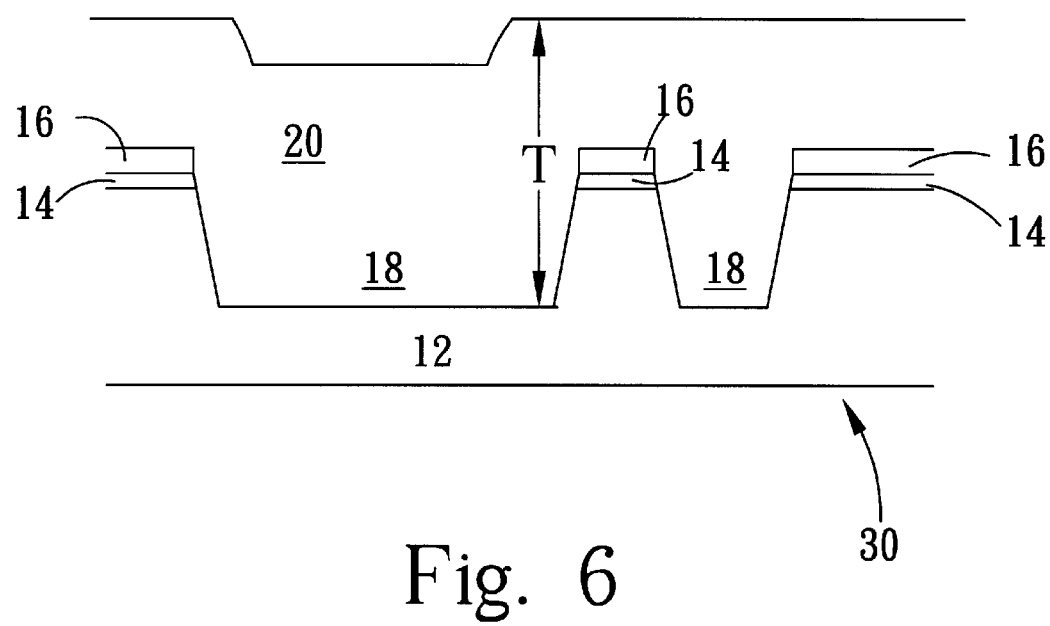
FIG. 6 is a cross-sectional view of the semiconductor wafer in FIG. 5 after performing the CMP process.
Figure 7:
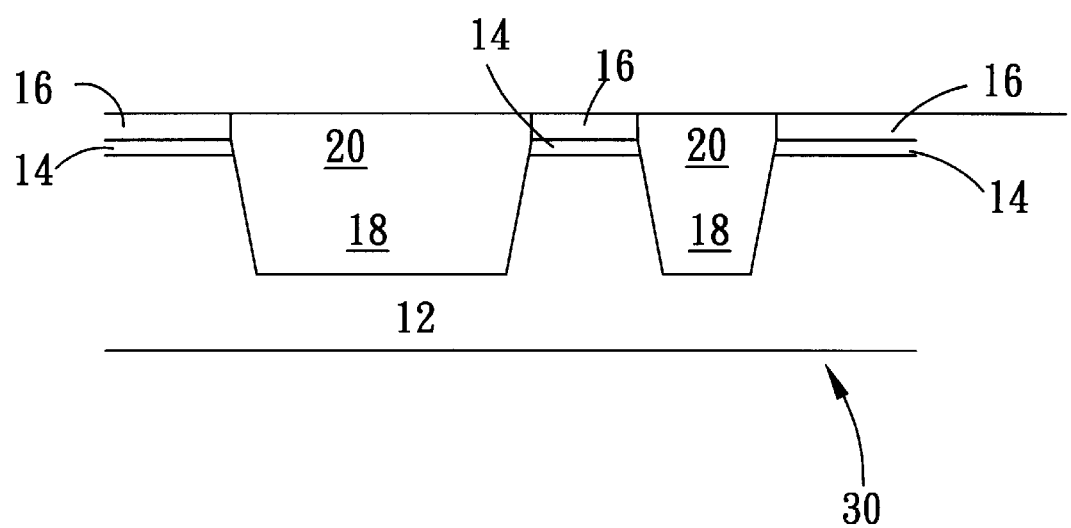
FIG. 7 is a cross-sectional view of the semiconductor wafer in FIG. 5 after performing an etching back process.

Please refer to FIG. 6. FIG. 6 is a cross-sectional view of the semiconductor wafer 30 after performing the CMP process. The CMP process is performed on the first dielectric layer 20 of the semiconductor wafer 30 to remove a predetermined thickness of the first dielectric layer 20. And the thickness of the remaining first dielectric layer 20 is measured and indicated by T in FIG. 6. When the thickness of the remaining first dielectric layer 20 is measured, an etching table having a plurality of thickness ranges of the remaining first dielectric layer 20 and corresponding etching back procedure or parameters of each of the thickness ranges is provided for performing a following etching back process. The etching back process is performed to horizontally remove the remaining first dielectric layer 20 according to the etching back procedure or parameters of the thickness range corresponding to the measured thickness of the remaining first dielectric layer 20 described in the etching table. The etching back process is usually a dry etching process that uses a plasma reaction to remove unwanted substances from the surface of the semiconductor wafer 30. Please refer to FIG. 7. FIG. 7 is a cross-sectional view of the semiconductor wafer 30 after performing the etching back process. When the etching back process is performed, a flat surface is formed by the second dielectric layer 16 and shallow trenches 18 filled with the remaining first dielectric layer 20 on the semiconductor wafer 30.

The semiconductor wafer 30 is controlled by a process flow control system, and the etching table is stored in the process flow control system. The process flow control system performs the etching back process according to the thickness of the remaining first dielectric layer 20 and the etching table.

Figure 8:
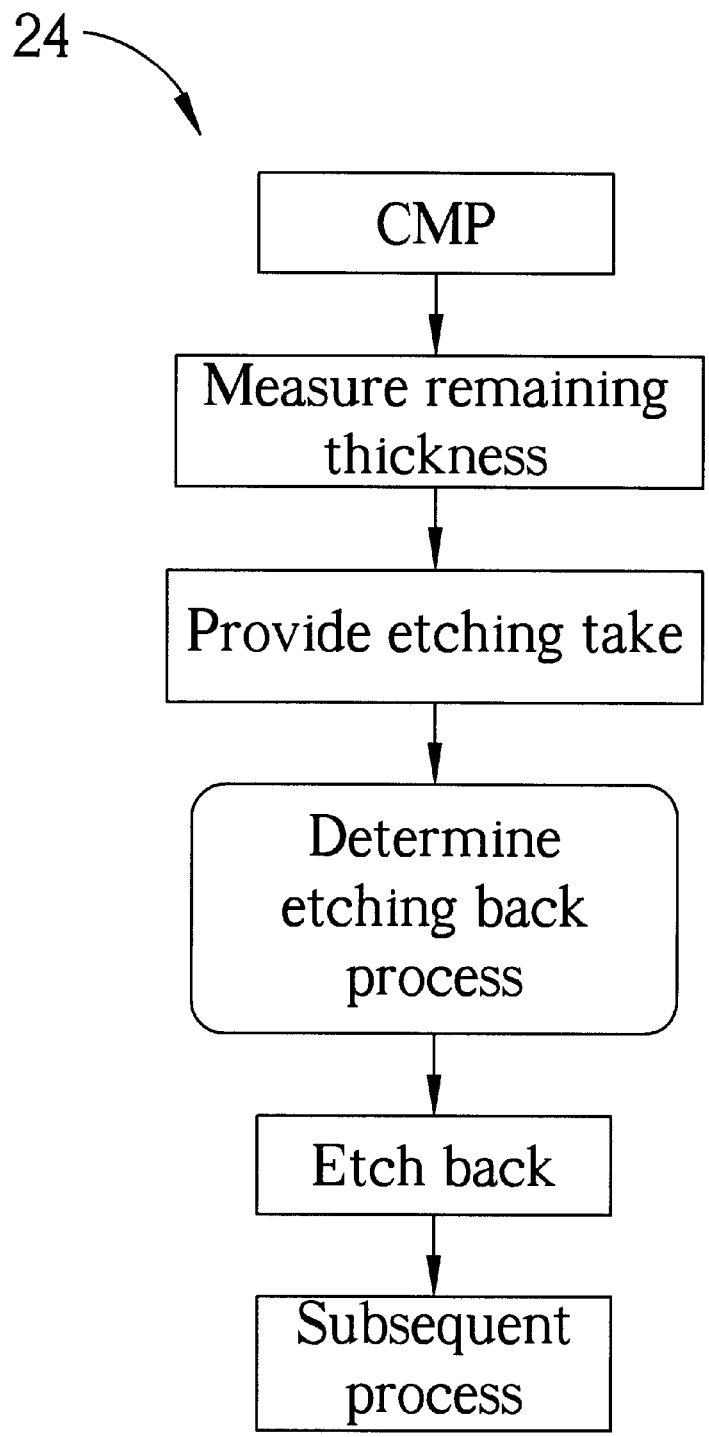
FIG. 8 is a flowchart of an etching method according to the present invention.

Please refer to FIG. 8. FIG. 8 is a flowchart of an etching method 24 according to the present invention. When the CMP process is performed on the semiconductor wafer, the thickness of the remaining first dielectric layer 20 is measured, and the process flow control system first selects one of the thickness ranges contained in the etching table according to the measured thickness of the remaining first dielectric layer 20 and then initiates the etching back process to horizontally remove the remaining first dielectric layer 20 according to the etching back procedure or parameters of the selected thickness range.

The etching back process performed on the remaining first dielectric layer 20 is a dry etching process and is completed in a dry etching system. The etching table can be stored in the dry etching system, and the dry etching system removes the remaining first dielectric layer 20 horizontally by performing an etching back process according to the thickness of the remaining first dielectric layer 20 and a corresponding etching back procedure in the etching table.

Figure 9:
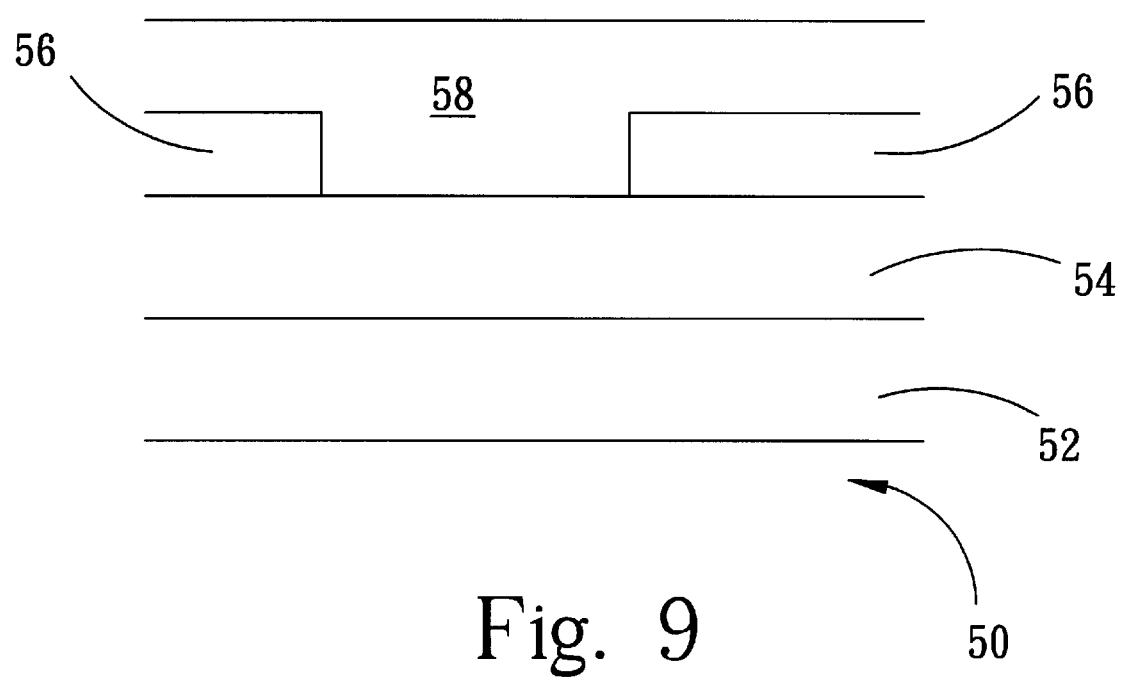
FIG. 9 is a cross-sectional view of a multilevel interconnected semiconductor wafer.

Please refer to FIG. 9. FIG. 9 is a cross-sectional view of a multilevel interconnected semiconductor wafer 50. The semiconductor wafer 50 comprises a silicon substrate 52, a MOS transistor 54 formed on the silicon substrate 52, a first metallic interconnecting layer 56 deposited on the MOS transistor 54 for connecting transistors and devices, and an inter-metal dielectric layer 58 deposited on the first metallic interconnecting layer 56 for isolating the first metallic interconnecting layer 56 from a second metallic interconnecting layer which will be positioned on the inter-metal dielectric layer 58 to prevent contacts between the two metallic interconnecting layers.

Before depositing the second metallic interconnecting layer onto the inter-metal dielectric layer 58, the planarization of the inter-metal dielectric layer 58 is performed to make the deposition easier and to increase the accuracy of the transferred pattern. During the planarization process of the inter-metal dielectric layer 58, an etching table comprising several thickness ranges of the remaining inter-metal dielectric layer 58 and corresponding etching back procedure or parameters of each of the thickness ranges is provided to prevent micro-scratches generated by performing a CMP process on the surface of the semiconductor wafer 50. The method of performing the planarization process comprises:

(1) removing a predetermined thickness of the inter-metal dielectric layer 58 by performing a CMP process, (2) measuring the thickness of the remaining inter-metal dielectric layer 58, (3) providing the etching table comprising a plurality of thickness ranges of the remaining inter-metal dielectric layer 58 and corresponding etching back procedure or parameters of each of the thickness ranges, and (4) performing an etching back process to horizontally remove the remaining inter-metal dielectric layer 58 according to the etching back procedure or parameters of the thickness range corresponding to the measured thickness of the remaining inter-metal dielectric layer 58 to planarize the inter-metal dielectric layer 58.

Compared with the prior art etching method 22, the etching method 24 chooses between different etching back processes according to the thickness of the remaining dielectric layer 20, 58. This means the thickness of the remaining dielectric layer 20, 58 can have a more flexible range, and thus micro-scratches caused by over-etching can be avoided.

Those skilled in the art will readily observe that numerous modifications and alterations of the device may be while retaining the teachings of the invention. Accordingly, the above disclosure should be construed as limited only by the metes and bounds of the appended claims.

What is claimed is:

1. A method for removing a first dielectric layer of a semiconductor wafer, the first dielectric layer being formed on the surface of a second dielectric layer of the semiconductor wafer, the method comprising:

performing a chemical mechanical polishing (CMP) process on the first dielectric layer to remove a thickness of the first dielectric layer without completely polishing the entire thickness of the first dielectric layer over the second dielectric layer;

measuring the remaining thickness of the polished first dielectric layer to obtain a measured thickness value T;

providing an etching table having a plurality of thickness ranges of the remaining first dielectric layer and corresponding etching back procedure or parameters of each of the thickness ranges; and performing a plasma etching back process to horizontally remove the remaining first dielectric layer according to the etching back procedure or parameters corresponding to a thickness range that covers the measured thickness value T, thereby exposing the second dielectric layer without scratching the second dielectric layer and the semiconductor wafer;

wherein after measuring the remaining thickness of the polished first dielectric layer, one set of the etching parameters corresponding to a thickness range that includes flow control system from the etching table to perform the etching back process.

2. The method of claim 1 wherein the second dielectric layer is formed of silicon nitride and the first dielectric layer is formed of silicon oxide.

3. The method of claim 2 wherein the semiconductor wafer further comprises a silicon oxide ($SiO_x$) pad layer positioned below the second dielectric layer for preventing damages to the wafer caused by heat-induced surface stress.

4. The method of claim 1 wherein the etching back process is a dry etching process.

5. The method of claim 4 wherein the dry etching process is performed in a dry etching system and the etching table is stored in the dry etching system, and wherein the dry etching system performs the etching back process to horizontally remove the remaining first dielectric layer according to the etching back procedure or parameters of the thickness range corresponding to the measured thickness of the remaining first dielectric layer.

6. A method of planarizing a dielectric layer without scratching the semiconductor wafer, the method comprising:

provide a substrate, wherein on the substrate are formed a plurality of trenches, a mask formed on the substrate in the region except the trench area, and a trench-filling dielectric layer formed on the substrate filling the trenches and covering the mask;

chemical-mechanical polishing the trench-filling dielectric layer to remove a thickness of the trench-filling dielectric layer without exposing the underlying mask;

measuring the remaining thickness of the polished trench-filling dielectric layer; and performing a dry etching back process, to remove a thickness of the remaining trench-filling dielectric layer at a more stable polishing rate than the CMP process and to expose the mask without scratching the mask, according to the measured thickness and an etching table stored in a process flow control system;

wherein the etching table contains a plurality of thickness ranges of the remaining trench-filling dielectric layer and each thickness range has one set of corresponding dry etching back parameters for performing the dry etching back process, wherein after measuring the remaining thickness of the trench filling dielectric layer, one set of etching parameters corresponding to a thickness range that includes the measured thickness, is automatically selected by the process flow control system from the etching table for performing the dry etching back process.

7. The method of claim 6 wherein the trench-filling dielectric layer and the mask are formed of different materials having different CMP polishing rates.

8. The method of claim 6 wherein the mask is a stacked layer consisting of a pad oxide layer and a silicon nitride layer formed on the pad oxide layer.

9. The method of claim 6 wherein the trench-filling dielectric layer is formed of silicon oxide.

* * * * *